INVENTORS
CARL J. LOWERY
BILLY B. WILLIAMS

INVENTORS
CARL J. LOWERY
BILLY B. WILLIAMS

United States Patent Office 3,525,025
Patented Aug. 18, 1970

3,525,025
ELECTRICALLY ISOLATED SEMICONDUCTOR DEVICES IN INTEGRATED CIRCUITS

Carl J. Lowery, Plano, and Billy B. Williams, Richardson, Tex., assignors to Texas Instruments Incorporated, Dallas, Tex., a corporation of Delaware Original application Aug. 2, 1965, Ser. No. 476,538, now Patent No. 3,370,995. Divided and this application Jan. 4, 1968, Ser. No. 719,805
Int. Cl. H01l 19/00
U.S. Cl. 317—235 3 Claims

ABSTRACT OF THE DISCLOSURE

Disclosed is an integrated circuit including a high resistivity monocrystalline substrate of one conductivity type having formed into one of its planar surfaces a semiconductor component having a first low resistivity semiconductor layer of opposite conductivity type than the substrate, epitaxially grown in a pocket formed in the substrate with its edge coplanar with the surface of the substrate to enable connections to be made to the layer, and forming a P-N junction with the substrate to electrically isolate the component from others formed in the substrate; a second higher resistivity semiconductor layer epitaxially grown to the first semiconductor layer; and regions diffused into the second layer of conductivity type appropriate to form the desired semiconductor component.

This application is a division of Ser. No. 476,538, filed on Aug. 2, 1965, now Pat. No. 3,370,995.

This invention relates generally to a process for fabricating semiconductor devices and to the resulting devices, and more particularly relates to electrically isolated semiconductor components formed within a single semiconductor substrate.

Integrated circuits offer advantages over circuits formed from discrete semiconductor components such as a reduction in overall circuit size, a reduction in overall circuit cost, and usually increased reliability. Based on prior integrated circuit technology, however, the individual components of an integrated circuit cannot be made to have the same high performance characteristics as discrete components of the same type because all lead contacts of the components must be brought to a single planar surface of the substrate and because the components must be electrically isolated from the other components of the circuit. Attempts to overcome these problems have resulted in more complex and expensive processes.

Various methods and techniques have been developed in the art in order to maintain a high degree of control over the depth, conductivity and lateral extent of the various doped regions of the components. Diffusion techniques using oxide masking offer excellent geometrical control and have gained wide acceptance. Diffusion of the impurity dopants, however, does not permit complete control of the impurity concentration because the distribution does not always follow a certain gradient. Also the second and third diffusions must always be of a higher concentration than the first if the conductivity type is to be converted and this is sometimes objectionable because it restricts performance. Planar diffused transistors, such as used in integrated circuits, also have a relatively high collector saturation resistance because of the distance between the actual collecting region and the collector contact at the surface of the substrate. The collector resistance has been reduced and the impurity concentrations more closely controlled by the use of epitaxial layers to form a transistor having a low resistivity region underlying the collector region and extending to the surface of the substrate to the collector contact. The techniques heretofore used to fabricate this type of transistor have required a large number of relatively intricate steps and are relatively expensive to carry out. Examples of the prior art processes and devices are hereafter described and illustrated to assist in understanding the novelty and merit of this invention.

An object of this invention is to provide a relatively simple process for fabricating a transistor or other semiconductor component in an integrated circuit which is electrically isolated from the other components of the circuit, yet which has the advantages of a low collector resistance.

Another object of the invention is to provide a significally less expensive process for fabricating integrated circuit devices.

A further object is to provide an improved integrated circuit transistor or similar device.

These and other objects are accomplished by forming a masking layer, such as an oxide, over a semiconductor substrate, such as monocrystalline silicon having a high resistivity, with openings in areas where a circuit component is to be located. The substrate is then subjected to a selective etchant and cavities are formed in the substrate which extend back under the edge of the masking layer around the periphery of the openings. The substrate is then reformed by successive layers, preferably grown epitaxially. The first deposited layer forms on the sides of the cavity as well as the bottom and extends into contact with the overhanging masking layer. The masking layer then protects the edge of the first layer from the second deposited layer so that when the masking layer is subsequently removed the edge of the first layer will be exposed so that electrical contact can be made directly to the interior layer.

In accordance with a more specific aspect of the invention, the substrate is formed of a high resistivity, monocrystalline semiconductor material of a first conductivity type. The first deposited layer is epitaxially grown and is of a second, or opposite, conductivity type, and has a high impurity concentration and therefore a relatively low resistance. The next deposited layer is epitaxially grown and also is of the second conductivity type, but has a low impurity concentration selected to form the collector region of a transistor. Base and emitter regions are then diffused into the collector region. A portion of the edge of the first epitaxial layer is then exposed by removing the masking layer and a metallic film collector contact formed across the exposed edge of the first layer.

The novel features believed characteristic of this invention are set forth in the appended claims. This invention itself, however, as well as other objects and advantages thereof, may best be understood by reference to the following detailed description of illustrative embodiments, when read in conjunction with the accompanying drawings, wherein:

The novelty and significance of this invention can best be understood when viewed in the light of the prior art techniques used to fabricate integrated circuits. For this reason, four different integrated circuit devices fabricated by prior art techniques are illustrated in FIGS. 1–4. At the outset, it should be understood that although NPN transistors will hereafter be described as illustrative of both the prior art techniques and the process of the present invention, neither the prior art techniques nor the processes of the present invention are limited to this type of transistor, but are equally applicable to PNP transistors as well as other similar semiconductor components.

Figure 1:
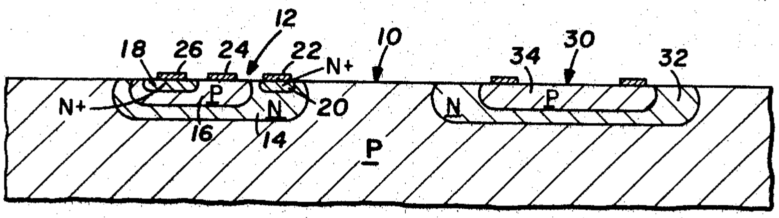
FIG. 1 is a sectional view of an integrated semiconductor network device constructed by prior art diffusion techniques.

FIG. 1 is a somewhat schematic sectional view of a portion of a wafer in which a transister 12 and resistor 30 have been formed by a conventional triple diffusion technique. The transistor 12 was formed by successive N-type, P-type and H+type diffusions 14, 16 and 18, respectively, each successive diffusion being of greater impurity concentration in order to convert from one conductivity type to the other. A collector contact region 20 was diffused at the same time as the emitter region 18 so as to provide ohmic contact with the metallized conductor strip 22 to the collector. The transistor is completed by a base contact 24 and an emitter contact 26. The resistor 30 is formed by an N-type diffusion 32 and a P-type diffusion 34, which are made at the same time as the collector and base regions 14 and 16, respectively. One major disadvantage of this type of structure is the high collector saturation resistance resulting from the fact that the collector contact 22 is spaced from the active collector region adjacent the collector-base junction by a substantial length of collector material which is relatively lightly doped and of relatively high resistivity. Another disadvantage is that the impurity concentration in the respective regions is often not uniform and cannot be controlled as closely as required for best performance characteristics.

Figure 2:
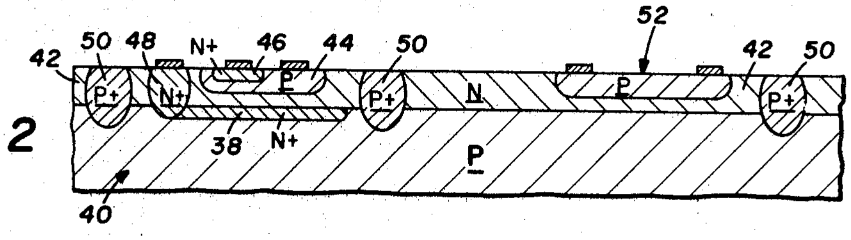
FIGS. 2–4 are sectional views of integrated semiconductor network devices constructed by prior art epitaxial and deposition techniques.

The objections to the triple diffused transistor are to a large degree overcome by the more complex structure illustrated in FIG. 2 wherein a low resistivity, high impurity concentration N-type region 38 is first diffused into the relatively high P-type substrate 40 over the area where the transistor is to be formed. An epitaxial layer 42 having an impurity concentration suitable for the collector region of the transistor is then formed over the entire substrate and the base and emitter regions 44 and 45 formed therein by conventional diffusion processes. A deep N-type diffusion 48 is then made through the epitaxial layer 42 to contact the high impurity concentration, low resistance diffused region 38. The low resistivity diffused zone 38 underlying the collector-base junction and the deep low resistivity diffusion 48 provide a low collector saturation resistance. A deep high impurity concentration P-type isolation ring 50 is diffused through the epitaxial region 42 into the substrate 40 to form an electrical isolation perimeter around the device within the epitaxial layer 42. The resistor 52 of formed in the epitaxial layer 42 at the same time as the base region 44. The disadvantage of this layer of structure is that it requires a large number of diffusions. For example, it will be noted that the low resistance region 38, the isolation regions 50, contact region 48, base region 44, and emitter region 46 all require separate diffusion steps. Alignment of the base region with the underlying low resistance region 38 is particularly difficult because the regions 38 are covered by the epitaxial layer.

Figure 3:
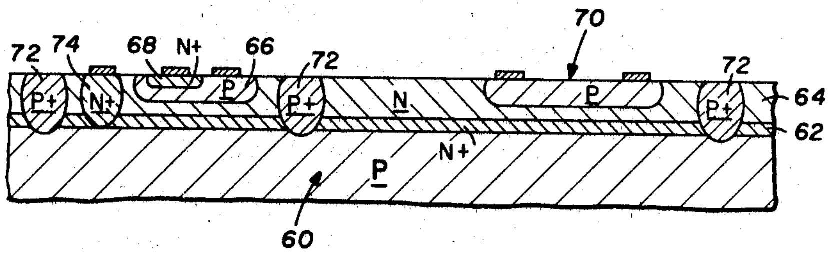

The wafer illustrated generally by the reference numeral 60 in FIG. 3 is similar to that shown in FIG. 2 except that the high impurity concentration, low resistivity layer 38 is replaced by an epitaxial layer 62 have a high impurity concentration and low resistance. This eliminates the need for masking the substrate preparatory to the diffusion of the regions 38, and also eliminates the subsequent problem of aligning the base regions with the regions 38. The base and collector regions 66 and 68 are then diffused, and deep isolation diffusion 72 are made through both epitaxial layers 64 and 62 and around the periphery of each component. A deep diffusion 74 is made into the high impurity concentration, low resistance layer 62 at some point within the isolation perimeter 72 so as to provide a low resistance electrical path to the collector region underlying the collector-base junction and thereby reduce the collector resistance to a minimum. This device has a low collector resistance, but requires a more complex and expensive fabrication process. Further, electrical isolation is dependent upon the diffused, high impurity concentration perimeters.

Figure 4:
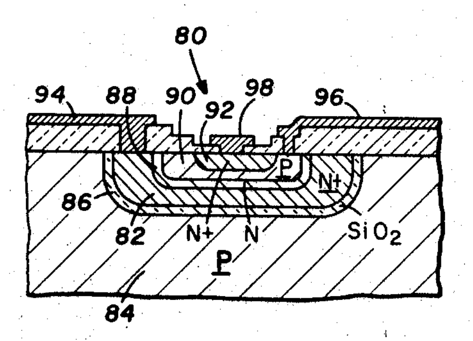

Still another planar device suitable for use in integrated circuits wherein a low resistance layer underlies a low impurity concentration collector region is indicated generally by the reference numeral 80 in FIG. 4. The technique for fabricating this transistor is described in detail and certain aspects thereof claimed in copending U.S. application Ser. No. 435,634, entitled, "Method of Forming Circuit Components Within a Substrate," filed Feb. 2, 1965, by Kenneth E. Bean et al., and assigned to the assignee of this invention. Briefly, the transistor 80 is fabricated by forming means on a substrate of monocrystalline low resistivity material 82, covering the substrate with the insulating oxide layer 86 and then with the material 84, and finally removing, as by lapping, the original substrate 82 to leave only the mesas in the material 84 which then becomes the substrate. The center of the low resistivity region 82 is removed by a selective etch and replaced by a high resistivity epitaxial region 88 suitably doped to form the collector region. The base and emitter regions 90 and 92 are then diffused into the collector region 88 to complete the transistor. Collector, base and emitter contacts 94, 96 and 98 may then be formed as illustrated. The transistor 80 is very well insulated from the remaining components of the integrated circuit and has a low collector resistance, but the process for fabricating the device is somewhat complicated and therefore expensive.

The present invention requires the use of a selective etchant for a semiconductor substrate, and a subsequent epitaxial reformation of the substrate with a material of a different impurity concentration or conductivity type. It is desirable to use a process which converts from an etching condition to a depositing condition as smoothly as possible and with a minimum of cost. In line with this objective, therefore, the substrate is preferably placed in in a reactor wherein the reactor constituents, during etching, are substantially the same as those during the epitaxial deposition. The basic formula for one such reaction is $SiCl_4+2H_2 \Delta HCl+Si$. This reaction is forced to the left by the addition of HCl or termination of $SiCl_4$, thus creating an etching condition. To change from an etching condition to one of deposition merely calls for the decrease or termination of the HCl flow which brings about a gradual change from an etching condition to one of deposition, which will be epitaxial if a monocrystalline substrate is used.

Figure 5:
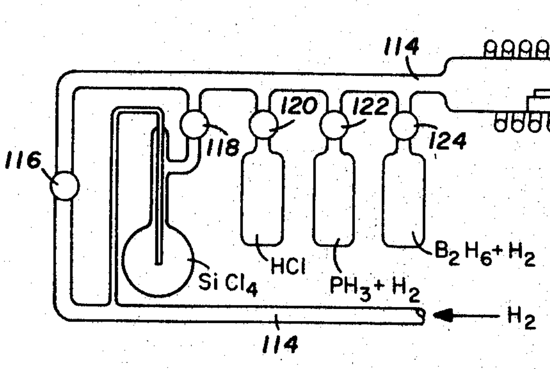
FIG. 5 is a schematic drawing of apparatus which may be used to carry out the process of the present invention.

The etch and regrowth process may be carried out in the apparatus represented in FIG. 5. A reactor in the form of a tube furnace 110 is heated by coils 112. The furnace may be of a horizontal or vertical type, may be suited for single or multiple substrate slices, and may be either resistivity or inductively heated. The silicon wafers are disposed within the furnace in such a position as to be exposed to gases directed into the tube furnace through the conduit 114. Purified dried hydrogen is used as the carrier gas and is introduced from a suitable source to the end of conduit 114. A valve 116 controls the rate of hydrogen flow through the conduit 114. Silicon tetrachloride vapor is introduced to the conduit 114 by bubbling a portion of the hydrogen gas through liquid silicon tetrachlorids contained in a flask as shown. The hydrogen chloride vapor is introduced to the conduit 114 from a cylinder containing anhydrous HCl as shown. The flow rates of the gases are controlled by conventional valves 116, 118 and 120.

As previously mentioned an etching condition is established when there is an excess of HCl. This may be accomplished in the presence of silicon tetrachloride vapors, or in the complete absence of silicon tetrachloride. The rate of etching is determined by a number of parameters, such as the temperature, flow rate and composition of the etchant vapors. For example, at a temperature of approximately 1200° C., a flow rate of thirty liters per minute of an etchant consisting of about 95% $H_2$ and 5% HCl resulted in an etch rate of approximately 0.22 micron/second on a silicon substrate. The etchant vapors do not materially affect a silicon dioxide film which may be serve as a mask.

In order to reverse the process and epitaxially reform the silicon substrate, flow of the HCl vapors is terminated so that the reactant flow consists of hydrogen and silicon tetrachloride. The epitaxially reformed regions may be doped by introducing to the reactant vapors and appropriate impurity containing compounds such as arsine ($Asd_3$) for N-type doping, or diborane ($B_2H_6$) for P-type doping. These doping compounds may be stored in cylinders filled with hydrogen as carrier gas as shown in FIG. 5. The concentration of the doping materials in the reactant stream, and thus the impurity concentration in the epitaxially regrown substrate, may be adjusted by the valves 122 and 124. Although specific doping compounds are mentioned here as illustrative examples, it is to be understood that the present invention is not intended to be limited to any particular type of doping material or to any particular doping material. The selection of an appropriate doping material will be dictated by the design characteristics of the devices being fabricated.

Referring now to FIGS. 6–11 which illustrate the process of the present invention, a portion of a silicon wafer on which an integrated circuit is to be formed is indicated generally by the reference numeral 150. Only the portion adjacent the surface of the substrate 150 is shown, is being appreciated that the substrate is of substantially greater thickness, a typical substrate being from eight to twelve mils thick. Further, it will be appropriated that the wafer 150 will customarily have a large number of components which will subsequently be formed into an integrated circuit by interconnecting lead patterns. During the fabrication process it is customary for each wafer of each integrated circuit to be a part if a semiconductor slice containing a large number of other wafers each embodying a complete network or integrated circuit. The wafer 150 will usually be a monocrystalline semiconductor material, although the broader aspects of the invention are applicable to polycrystalline and amorphous semiconductor material. When a monocrystalline wafer is used, the upper surface should be cut parallel to a Miller indices plane other than the [111]. For example, the surface 152 might be parallel to the [110] or the [101] plane. If the surface 152 is parallel to the [111] plane, then preferential etching will sometimes result in an asymmetrical cavity which is generally unsuitable. However, by orienting the crystal on other than the [111] plane, a symmetrical cavity can be attained by etching.

Figure 6:
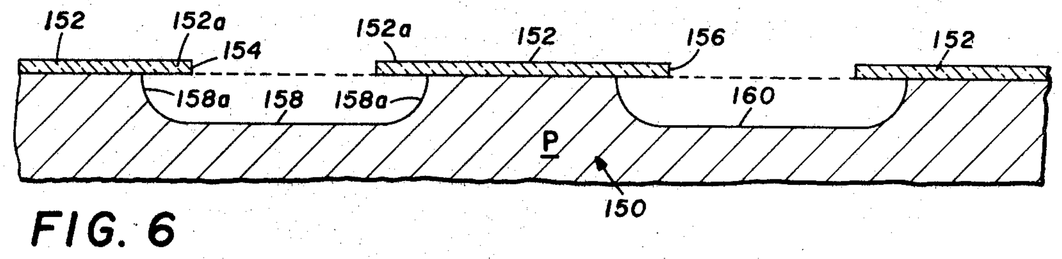
FIGS. 6–11 are sectional views of a wafer which illustrate successive stages in the fabrication of an integrated network by means of the process of this invention.

The substrate 150 is then covered with a silicon dioxide film 152, or other suitable etchant mask. The silicon dioxide film may be formed by any conventional technique. such as by subjecting the substrate to steam at a temperature of about 1200° C. or by a deposition technique. The oxide film 152 is patterned by a photo-resist and selective etch technique to form openings 154 and 156. The wafer 150 is then placed in the furnace 110 and subjected to an etch condition wherein there is an excess of hydrogen chloride as heretofore described. The etchant does not affect the silicon oxide masking layer 152 but attacks the substrate 150 to etch cavities 158 and 160 as shown in FIG. 6. It is important to note that the etchant acts on all exposed surfaces of the substrate so that as each cavity deepens, the peripheral wall of the cavity is also etched away as at **158*a* so that the silicon oxide layer 152 extends over the edge of the cavity a distance corresponding roughly to the depth of the cavity. The peripheral overhanging portion 152*a*** of the oxide layer plays an important role in the process of the present invention.

After the substrate has been subjected to the etchant conditions for a sufficient period of time to form a cavity of the desired depth, usually up to about 0.5 mil, the flow of hydrogen chloride is terminated and the flow of silicon tetrachloride started to provide a deposition condition. At the same time, the desired doping impurity is introduced to the process stream so that epitaxial layers 162 and 164 are formed simultaneously in the bottom of the cavities 158 and 160, respectively. It will be noted that the epitaxial layers form substantially evenly on all exposed surfaces of the cavities and consequently form on the side **158*a* up to the overhanging silicon oxide 152*a*, as illustrated at 162*a***, so that the edge of the layers form a part of the planar surface of the substrate.

After a short purge cycle the concentration of the dopant vapor in the reactant stream may be either varied or changed to a different conductivity type of doping compound and the epitaxial redeposition process continued to form a second epitaxial layer which will completely refill the cavities 158 and 160 by the layers 166 and 168, respectively, unless it is desired to have more than two layers. It is important to note that the edge **162*a* of the epitaxial layer 162 at the planar surface are protected by the overhanging silicon oxide masking layer 152*a* so that the second deposited epitaxial layer 166 does not grow over this edge of the first deposited epitaxial layer. As a result, when the oxide mask 152 is stripped from the substrate, or removed from the substrate in preselected areas, the edge of the first deposited epitaxial layer 162** appears at the planar surface of the substrate.

In accordance with one aspect of this invention, the substrate 150 is formed of a lightly doped semiconductor material of one type and the deposited layer 162 is a more heavily doped layer of the opposite type. These materials from a P-N junction between the substrate and first layer 162 which separates the entire layer 162 from the substrate. This junction will electrically isolate a component formed within the pocket up to the reverse breakdown voltage of the junction. This provides a very simple process by which one component of an integrated circuit may be electrically insulated from the other components of the circuit.

In a more specific embodiment of the invention, a transistor is formed in the isolated pocket. In this case, the substrate 150 may be monocrystalline silicon from about eight to twelve mils in thickness to facilitate handling. The silicon may be either P-type or N-type, depending upon the particular type of transistor being fabricated. In either case, however, the substrate 150 would be lightly doped and might have, for example, a resistivity of from about five ohm-centimeters up to intrinsic silicon, depending upon the voltage to be isolated. Assuming that the substrate 150 is P-type material, as illustrated in the drawings, the first epitaxial layers 162 and 164 would be heavily doped N-type materials as represented by the notation N+ to provide the desired isolation and reduce the collector resistance as will presently be described. The second epitaxial region 166 would be a more lightly doped N-type region, represented by the character N, the doping level being selected to form the collector region of the transistor. It will be recognized that this is the structure shown in FIG. 8.

Figure 9:
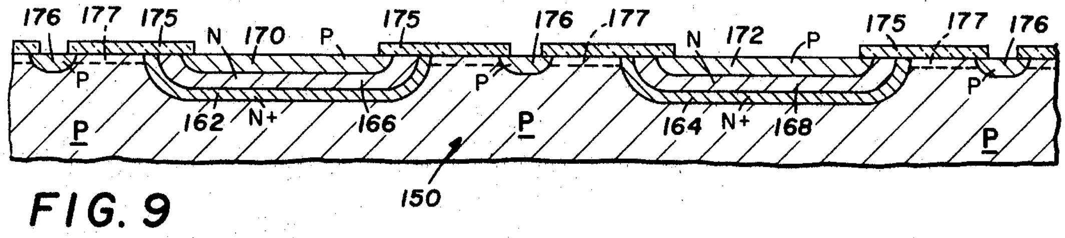
Figure 10:
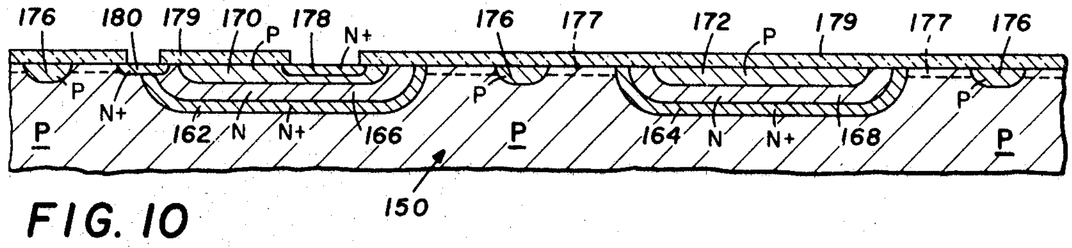
Figure 11:
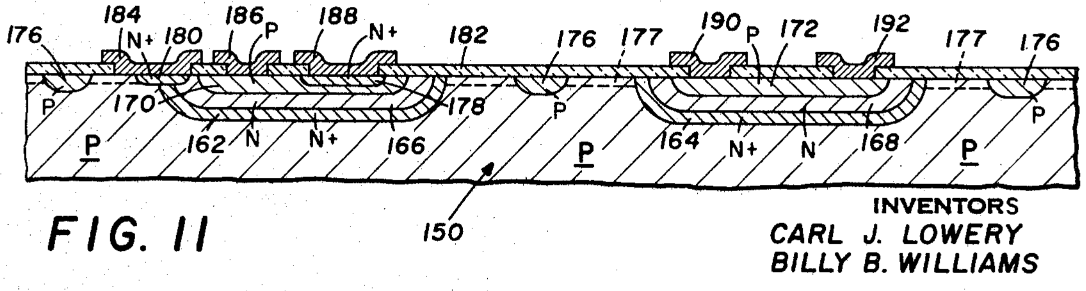

A P-type base region 170 is then diffused through an oxide mask 175 patterned as illustrated in FIG. 9. Under some process conditions there is a tendency for an N-type region 177 indicated by the dotted line to form at the junction between the substrate and the silicon masking layer 175. For this reason, it is also desirable as a precautionary measure to make a P-type diffusion 176 around the periphery of each active component for electrical isolation purposes at the same time as the base diffusion 170. Next an oxide mask 179 is patterned as illustrated in FIG. 10 to leave openings over one portion of the base region 170 and over a portion of the N+ layer 162 at the surface. An N+ emitter region 178 is diffused into the base region and a collector contact region 180 diffused over the edge of layer 162. Finally, an oxide mask 182 is formed as illustrated in FIG. 11 and a metallic film deposited and patterned to form the collector, base and emitter contacts 184, 186 and 188, respectively, to the transistor device. A resistor may be diffused in the other epitaxial layer 168 at the same time as the base region 170 and contacts 190 and 192 subsequently applied as illustrated in FIG. 11.

It will be noted that both the transistor and the resistor are electrically insulated from the remainder of the substrate by the P-N junction between the substrate 150 and the respective heavily doped layers 162 and 164 and the oxide layer 182. The P-type isolation diffusion 176 around each refilled cavity is a precautionary measure to counteract the N-type region which tends to form at the surface of the substrate adjacent the oxide layer and maintain the insulation.

Figure 7:
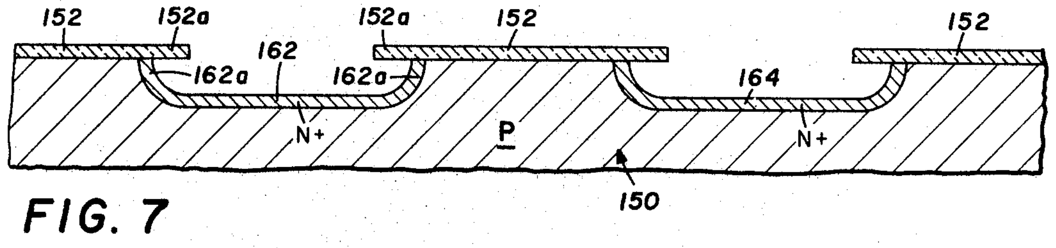
Figure 8:
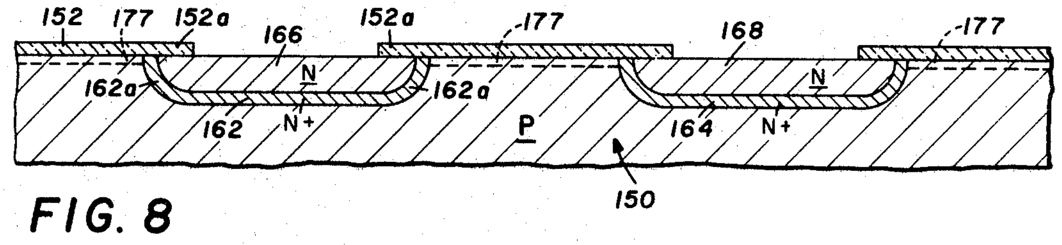

The transistor formed by the collector region 166, the base region 170 and the emitter region 178 has a low collector resistance because of the heavily doped low resistivity layer 162 which extends from the surface under the active collector region adjacent the collector-base junction. This provides a transistor in an integrated circuit which approaches a discrete transistor device in both electrical insulation and collector resistance. Further, the transistor, and hence the entire integrated circuit may be fabricated by a process which approaches the simple and low cost process used for fabricating discrete devices without the attendant cost of packaging the discrete devices. In this connection, it will be noted that only four major steps are required, which is the same number as the common triple diffusion process, because the steps illustrated in FIGS. 6, 7 and 8 are performed without removing the substrate from the reactor and are as a practical matter a single process step. Then only the base, emitter and lead pattern steps are required to complete the transistor.

Although an NPN silicon transistor has been described it is to be understood that the invention is applicable to either NPN or PNP transistors and similar semiconductor devices made from silicon or other semiconductor materials. Also it is to be understood that etchants other than vapor etchants may be used, such as liquid etchants.

Although preferred embodiments of the invention have been described in detail, it is to be understood that various changes, substitutions, and alterations can be made therein without departing from the spirit and scope of the invention as defined by the appended claims.

What is claimed is:

1. In an integrated semiconductor network, the combination of a high resistivity, monocrystalline substrate of one conductivity type having a planar surface and a plurality of semiconductor components formed in the substrate, at least one semiconductor component comprising a first epitaxial layer of a conductivity type opposite from that of the substrate within a pocket in the substrate with the edge of the layer coplanar with the planar surface of the substrate and forming a P-N junction with the substrate which extends to the planar surface around the periphery of the pocket, a second epitaxial layer upon the first epitaxial layer having a higher resistivity than the first epitaxial layer and forming a part of a semiconductor component, the surface of the epitaxial material within the pocket being substantially coplanar with the surface of the substrate.

2. The combination defined in claim 1 wherein the first epitaxial layer has a high impurity concentration, the second epitaxial layer is of the same conductivity type and has a lower impurity concentration and forms the collector of a transistor, and further characterized by base and emitter regions for the transistor formed in the collector region, and collector, base and emitter contacts at the planar surface engaging the first epitaxial layer, the base region and the emitter regions, respectively.

3. The combination defined in claim 1 wherein the first epitaxial layer has a high impurity concentration, the second epitaxial layer is of the same conductivity type and has a lower impurity concentration and forms the collector region of a transistor, and further characterized by a first diffused region in the second semiconductor layer forming the base of the transistor, a second diffused region in the first diffused region forming the emitter of the transistor, a collector contact engaging the edge of the first epitaxial layer at the planar surface, a base contact engaging the first diffused region, and an emitter contact engaging the second diffused region.

References Cited

UNITED STATES PATENTS

| | | | |
|---|---|---|---|
| 3,404,321 | 11/1968 | Kurosawa et al. | 317—235 |
| 3,275,846 | 9/1966 | Bailey | 307—88.5 |
| 3,312,882 | 4/1967 | Pollock | 317—235 |
| 3,355,669 | 11/1967 | Avins | 329—103 |
| 3,271,685 | 9/1967 | Husker | 325—440 |
| 3,386,865 | 6/1968 | Doo | 148—175 |
| 3,320,485 | 5/1967 | Bluie | 317—101 |

JOHN W. HUCKERT, Primary Examiner

B. ESTRIN, Assistant Examiner

U.S. Cl. X.R.

317—234